(12) United States Patent
Ganfield et al.

(10) Patent No.: US 7,225,097 B2
(45) Date of Patent: May 29, 2007

(54) METHODS AND APPARATUS FOR MEMORY CALIBRATION

(75) Inventors: Paul A. Ganfield, Rochester, MN (US); Brian M. McKevett, Rochester, MN (US); Tolga Ozguner, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/191,418

(22) Filed: Jul. 28, 2005

(65) Prior Publication Data

US 2007/0027650 A1 Feb. 1, 2007

(51) Int. Cl.
*G06F 17/00* (2006.01)
(52) U.S. Cl. .................. 702/107; 702/85; 714/718; 714/724; 365/201; 324/765
(58) Field of Classification Search ............... 702/107, 702/85, 117; 714/724, 718–720, 745, 799, 714/769; 365/210, 189.01; 324/763, 765
See application file for complete search history.

(56) References Cited

U.S. PATENT DOCUMENTS

| 5,442,642 | A | * | 8/1995 | Ingalls et al. ............... 714/733 |
| 5,629,880 | A | * | 5/1997 | Negishi ....................... 702/85 |
| 6,243,841 | B1 | * | 6/2001 | Mydill ........................ 714/724 |
| 6,567,941 | B1 | * | 5/2003 | Turnquist et al. ........... 714/724 |

\* cited by examiner

*Primary Examiner*—John Barlow
*Assistant Examiner*—Hien Vo
(74) *Attorney, Agent, or Firm*—Dugan & Dugan

(57) ABSTRACT

In a first aspect, a first method is provided for adjusting memory system calibration. The first method includes the steps of (1) while in a first operating state, calibrating the memory system using a first amount of calibration data so that functional data may be read from and written to memory of the memory system; and (2) while in a second operating state, calibrating the memory system using a second amount of calibration data so that functional data may be read from and written to the memory, wherein the second amount of calibration data is smaller than the first amount of calibration data. Numerous other aspects are provided.

20 Claims, 3 Drawing Sheets

METHODS AND APPARATUS FOR MEMORY CALIBRATION

FIELD OF THE INVENTION

The present invention relates generally to computers, and more particularly to methods and apparatus for calibrating memory within a computer.

BACKGROUND

A memory system may include a memory interface controller (MIC) coupled to a memory via a plurality of pins. To ensure data may be properly read from and/or written to the memory, the memory system may be calibrated during system initialization (e.g., before operation of the memory system to store or read actual data). Calibration may occur on data such as an asserted signal serving as a bit when it is transmitted to the memory and when the data is received by the memory. Transmit calibration may center (e.g., adjust a capture point of) a signal when transmitted (e.g., from a controller) to the memory such that the memory may capture the data and receive calibration may center the data when received by the memory controller such that the memory controller may capture the data. In this manner, the memory system may be calibrated so that components of the memory system such as a memory controller and/or memory may capture data, such as an asserted signal serving as a bit, at a stable portion of the signal. The stable portion of the signal where the data is captured may be referred to as the data eye. During initial calibration, a large amount of data, such as a respective 1024-bit pattern, may be transmitted from the MIC to pins of the memory. The bit patterns employed during initial calibration may be stored in buffers of the MIC, which may be used to store other data after initial calibration. Once initially calibrated, the memory system may store actual data.

During operation of a memory system, changes in operating conditions such as fluctuations in temperature or voltage of the memory system, for example, may cause the data eye to shift. Accordingly, a need exists for adjusting calibration of a memory system during operation.

SUMMARY OF THE INVENTION

In a first aspect of the invention, a first method is provided for adjusting memory system calibration. The first method includes the steps of (1) while in a first operating state, calibrating the memory system using a first amount of calibration data so that functional data may be read from and written to memory of the memory system; and (2) while in a second operating state, calibrating the memory system using a second amount of calibration data so that functional data may be read from and written to the memory, wherein the second amount of calibration data is smaller than the first amount of calibration data.

In a second aspect of the invention, a first apparatus is provided for adjusting memory system calibration. The first apparatus includes (1) a first array for storing a first amount of calibration data; (2) a second array for storing a second amount of calibration data, wherein the second amount of calibration data is smaller than the first amount of calibration data; and (3) calibration adjustment logic coupled to the first and second arrays. The apparatus is adapted to (a) while the memory system operates in a first operating state, calibrate the memory system using the first amount of calibration data so that calibration data may be read from and written to memory of the memory system; and (b) while the memory system operates in a second operating state, calibrate the memory system using the second amount of calibration data so that calibration data may be read from and written to the memory.

In a third aspect of the invention, a first system is provided for adjusting memory system calibration. The first system includes (1) an apparatus for adjusting memory system calibration having (a) a first array for storing a first amount of calibration data; (b) a second array for storing a second amount of calibration data, wherein the second amount of calibration data is smaller than the first amount of calibration data; and (c) calibration adjustment logic coupled to the first and second arrays; and (2) a memory coupled to the apparatus for adjusting memory system calibration. The apparatus is adapted to (i) while the memory system operates in a first operating state, calibrate the memory system using the first amount of calibration data so that functional data may be read from and written to the memory of the memory system; and (ii) while the memory system operates in a second operating state, calibrate the memory system using the second amount of calibration data so that functional data may be read from and written to the memory. Numerous other aspects are provided in accordance with these and other aspects of the invention.

Other features and aspects of the present invention will become more fully apparent from the following detailed description, the appended claims and the accompanying drawings.

DETAILED DESCRIPTION

During operation of a memory system, operating conditions such as a voltage applied across, current flowing through and/or a temperature of the memory system, for example, may cause the data eye to shift. Consequently, the initial calibration of a memory system may require adjustment to ensure functional data is properly read from and/or written to the memory or the memory controller. The present invention provides methods and apparatus for adjusting calibration of the memory system during memory system operation. For example, the present invention may employ calibration adjustment logic to adjust a previous calibration (e.g., the initial calibration) of the memory system. The calibration adjustment logic may be adapted to adjust calibration of the memory system using a reduced amount of calibration data (e.g., recalibration data) compared to that employed for the initial calibration. For example, a size of a bit (or byte) pattern transmitted to one or more pins of the memory may be reduced compared to the bit pattern size employed previously (e.g., during initial calibration). Further, because bit patterns may be reused, a number of different bit patterns employed during recalibration may be reduced compared to that employed during the previous calibration. Therefore, a space required by the memory system to store the recalibration data may be reduced. Further, a time employed for the recalibration may be reduced compared to the time employed for the previous (e.g., initial) calibration. In this manner, the present invention provides methods and apparatus for adjusting calibration of a memory system during memory system operation.

Figure 1:
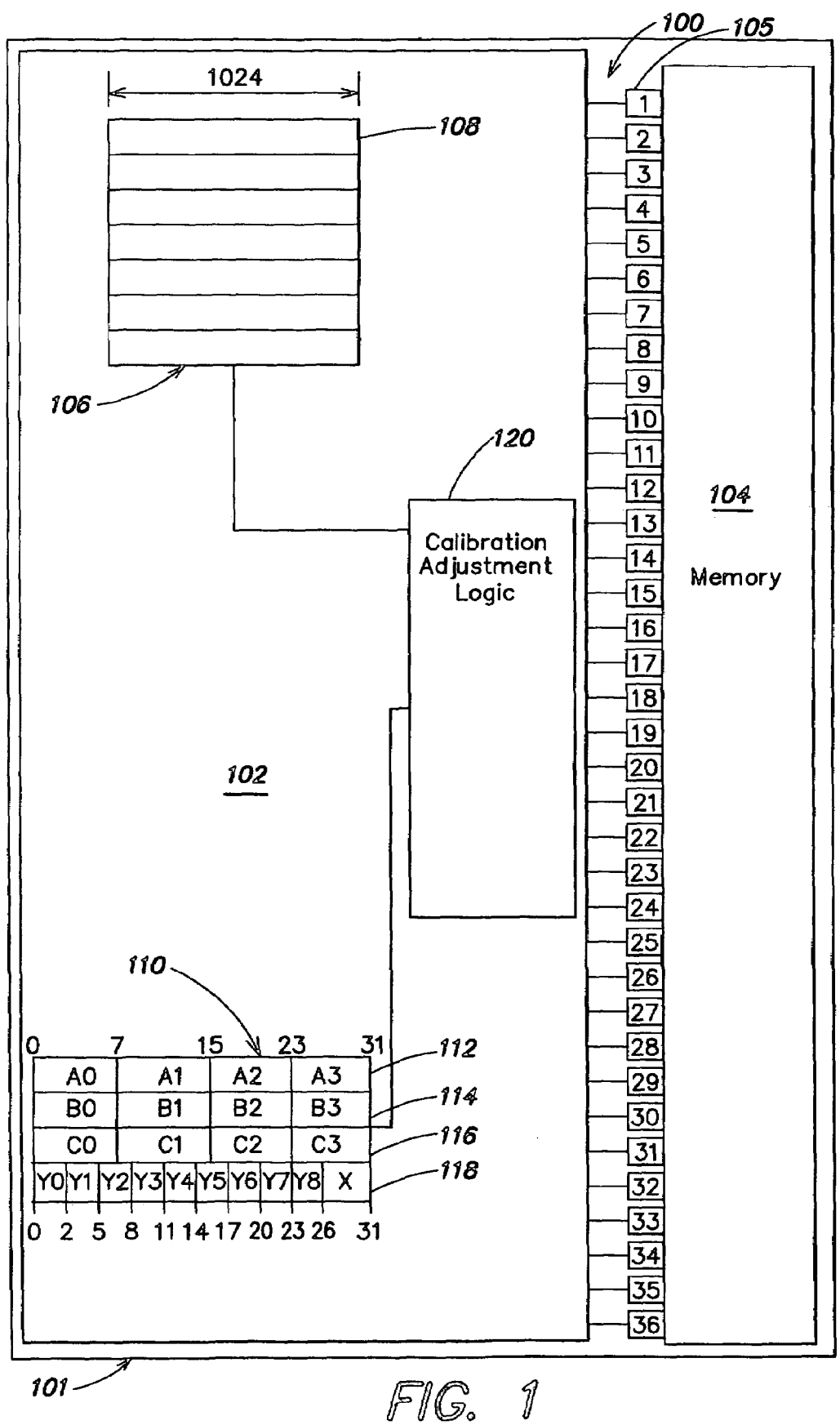
FIG. 1 is a block diagram of a system for calibrating memory in accordance with an embodiment of the present invention.

FIG. 1 is a block diagram of a system for calibrating memory in accordance with an embodiment of the present invention. With reference to FIG. 1, the system 100 may be included in a computer 101 or another suitable device. The system 100 may include a memory interface controller (MIC) 102 coupled to a memory 104 (e.g., one or more DRAMs or another suitable memory). More specifically, the MIC 102 may couple to one or more pins 105 of the memory 104. In some embodiment, the memory 104 may include thirty-six pins 105 (although a larger or smaller number of pins may be employed).

The MIC 102 may be adapted to transmit data to and receive data from the memory 104. The MIC 102 may include a first array 106 adapted to store a first set of data (e.g., calibration data). The first set of data may be a plurality of configuration data bit (or byte) patterns employed to calibrate the memory system 100 while in a first operating state. For example, the first set of data may be employed by the system 100 during initialization to initially calibrate the system 100. In some embodiments, the first array 106 may include thirty-six 1024-bit wide entries 108. However, the first array 106 may include a larger or smaller number of entries. Further each entry 108 of the first array 106 may be larger (e.g., wider) or smaller (e.g., narrower).

The MIC 102 may include a second array 110 adapted to store a second set of data (e.g., calibration data). The second set of data may be data employed to calibrate (e.g., periodically) the memory system 100 while in a second operating state. For example, the second set of data may be employed to calibrate the memory system 100 while or after the memory system 100 operates in a functional mode (e.g., to store actual or functional data). The second array 110 may include a first register 112 adapted to store a first configuration data bit (or byte) pattern included in the second set of data, a second register 114 adapted to store a second configuration data bit (or byte) pattern included in the second set of data and a third register 116 adapted to store a third configuration data bit (or byte) pattern included in the second set of data. In some embodiments, the first, second and third registers 112, 114, 116 are 32-bit wide registers (although the first, second and/or third registers may be of a larger or smaller width). In some embodiments, the first configuration data bit pattern may include four bytes A0, A1, A2, A3, and therefore be thirty-two bits in size. Similarly, the second configuration data bit pattern may include four bytes B0, B1, B2, B3 and therefore, be thirty-two bits in size, and the third configuration data bit pattern may include four bytes C0, C1, C2, C3, and therefore be thirty-two bits in size. The sizes of the first, second and third configuration data bit patterns are exemplary, and therefore, a larger or smaller size may be employed for the first, second and/or third configuration data bit patterns.

The second array 110 may include a fourth register 118 adapted to store control signals for calibration adjustment logic 120 (described below) coupled to the first and second arrays 106, 110. In some embodiments, the fourth register 118 may be thirty-two bits wide (although the fourth register may be of a larger or smaller width). In some embodiments, the control signals may include nine three-bit one-hot control signals Y0–Y8. However, each control signal may be of a larger or smaller size and/or different. Further, a larger or smaller number of control signals may be employed.

The calibration adjustment logic 120 may be coupled to the first and second arrays 106, 110 and to one or more pins 105 of the memory 104. The calibration adjustment logic 120 may be adapted to output respective configuration data bit (or byte) patterns from the first array 106 to pins 105 of the memory 104 and adapted to output (e.g., repeatedly) the configuration data bit (or byte) patterns received from the second array 110 to corresponding pins 105 of the memory 104. For example, while in the second operating state, each pin 105 of the memory system 100 may be calibrated based on data (e.g., a portion of the second set of data) received by the pin 105 and data (e.g., different portion of the second set of data) received by nearest neighboring pins. In this manner, during calibration while operating in the second state, the same configuration data bit patterns may be transmitted to different non-adjacent pins of the memory 104, and therefore, the number of configuration data bit patterns stored by the MIC 102 may be reduced. Consequently, an amount of data stored by the MIC 102 may be reduced. Thus, the calibration adjustment logic 120 may repeatedly output the first configuration data bit (or byte) pattern A0–A3 to some pins 105 of the memory 104, the second configuration data bit (or byte) pattern B0–B3 to other pins 105 of the memory 104 and the third configuration data bit (or byte) patterns C0–C3 to remaining pins 105 of the memory 104 such that the calibration adjustment logic 120 does not output the same configuration data bit pattern to adjacent pins 105 of the memory 104. The memory system 100 may be calibrated (e.g., while in the second operating state) based on the configuration data bit patterns A0–A3, B0–B3, C0–C3 output by the calibration adjustment logic 120.

Figure 2:
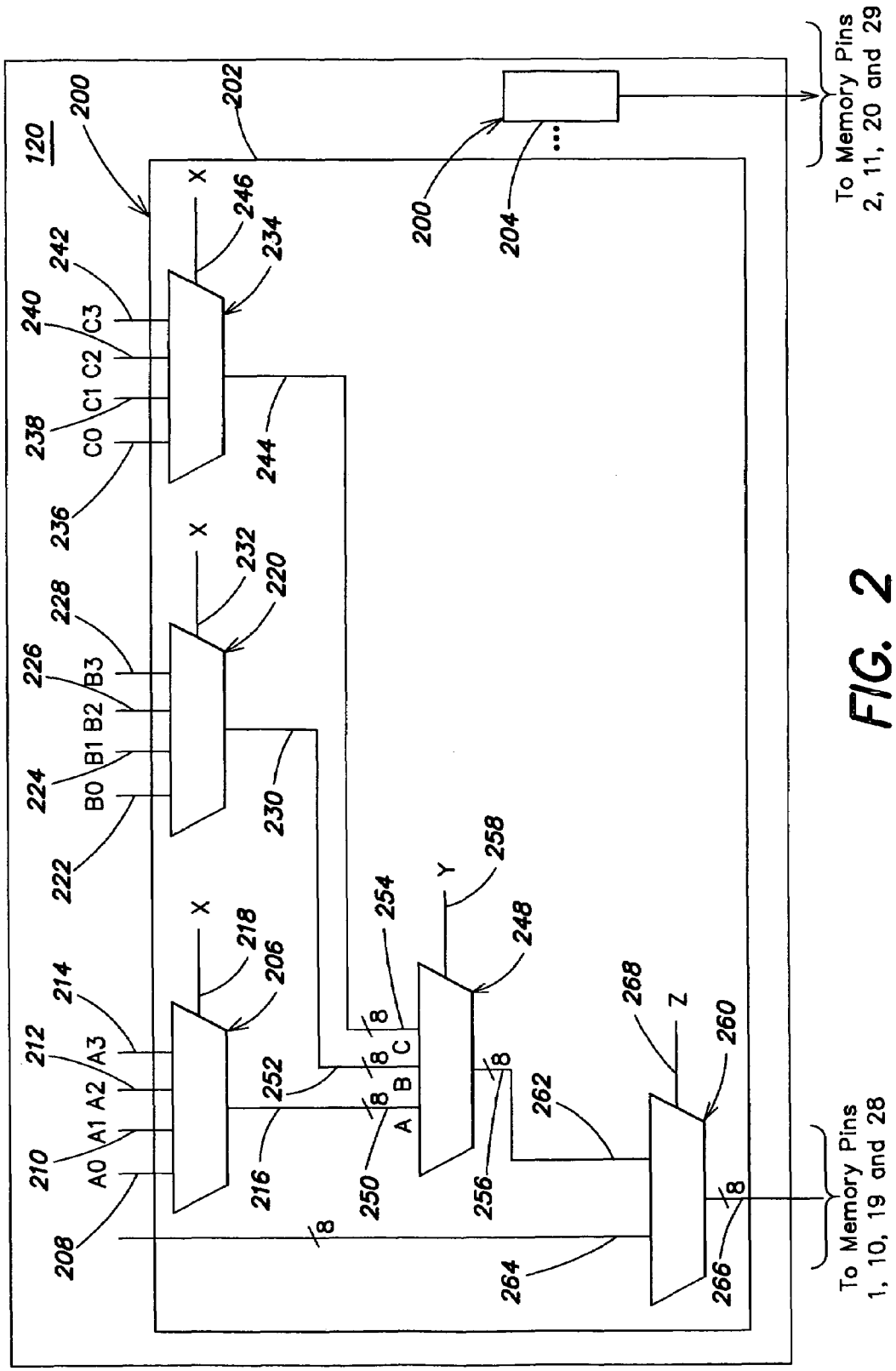
FIG. 2 is a block diagram of calibration adjustment logic included in the system for calibrating memory in accordance with an embodiment of the present invention.

FIG. 2 is a block diagram of calibration adjustment logic included in the system for calibrating memory in accordance with an embodiment of the present invention. With reference to FIG. 2, the calibration adjustment logic 120 may include a plurality of bit (or byte) pattern selection logic 200 adapted to selectively output (e.g., repeatedly) a configuration data bit (or byte) pattern from the first or second array 106, 110 to one or more pins 105 of the memory 104. In some embodiments, the calibration adjustment logic 120 may include nine bit pattern selection logic 200 (although a larger or smaller number of bit pattern selection logic 200 may be employed). Each bit pattern selection logic 200 may be adapted to output a configuration data bit pattern to four pins 105 of the memory 104 (although each bit pattern selection logic 200 may output a configuration data bit pattern to a larger or smaller number of memory pins 105). For example, the calibration adjustment logic 120 may include first bit pattern selection logic 202 adapted to output a configuration data bit pattern to pins 1, 10, 19 and 28 of the memory 104, second bit pattern selection logic 204 adapted to output a configuration data bit pattern to pins 2, 11, 20 and 29 of the memory 104, and so on.

Bit pattern selection logic 200 may include a first multiplexer 206 coupled to the second array 110 via first through fourth input 208–214. A first byte A0 of the first configuration data bit pattern of the second array 110 may be input by the first input 208, a second byte A1 of the first configuration data bit pattern of the second array 110 may be input by the second input 210, a third byte A2 of the first configuration data bit pattern of the second array 110 may be input by the third input 212 and a fourth byte A3 of the first configuration data bit pattern of the second array 110 may be input by the fourth input 214. The first multiplexer 206 may be adapted to selectively output data, which was input by the first multiplexer 206, via an output 216 based on a control signal (e.g., select signal) X input by the first multiplexer 206 via a fifth input 218.

Similarly, bit pattern selection logic 200 may include a second multiplexer 220 coupled to the second array 110 via first through fourth input 222–228. A first byte B0 of the second configuration data bit pattern of the second array 110 may be input by the first input 222, a second byte B1 of the second configuration data bit pattern of the second array 110 may be input by the second input 224, a third byte B2 of the second configuration data bit pattern of the second array 110 may be input by the third input 226 and a fourth byte B3 of the second configuration data bit pattern of the second array 110 may be input by the fourth input 228. The second multiplexer 220 may be adapted to selectively output data, which was input by the second multiplexer 220, via an output 230 based on a control signal (e.g., select signal) X input by the second multiplexer 220 via a fifth input 232.

Further, the bit pattern selection logic 200 may include a third multiplexer 234 coupled to the second array 110 via first through fourth input 236–242. A first byte C0 of the third configuration data bit pattern of the second array 110 may be input by the first input 236, a second byte C1 of the third configuration data bit pattern of the second array 110 may be input by the second input 238, a third byte C2 of the third configuration data bit pattern of the second array 110 may be input by the third input 240 and a fourth byte C3 of the third configuration data bit pattern of the second array 110 may be input by the fourth input 242. The third multiplexer 234 may be adapted to selectively output data, which was input by the third multiplexer 234, via an output 244 based on a control signal (e.g., select signal) X input by the third multiplexer 234 via a fifth input 246.

The same control signal X may be applied to the first through third multiplexers 206, 220, 234 (although different control signals may be applied to the multiplexers 206, 220, 234, respectively, to achieve the result described below). Therefore, during a first time (e.g., clock cycle), the control signal X is applied to the first through third multiplexers 206, 220, 234 such that the first byte A0 is output from the first multiplexer 206, the first byte B0 is output from the second multiplexer 220 and the first byte C0 is output from the third multiplexer 234. During a second time, the control signal X is applied to the first through third multiplexers 206, 220, 234 such that the second byte A1 is output from the first multiplexer 206, the second byte B1 is output from the second multiplexer 220 and the second byte C1 is output from the third multiplexer 234. Similarly, during a third time, the control signal X is applied to the first through third multiplexers 206, 220, 234 such that the third byte A2 is output from the first multiplexer 206, the third byte B2 is output from the second multiplexer 220 and the third byte C2 is output from the third multiplexer 234. Further, during a fourth time, the control signal X is applied to the first through third multiplexers 206, 220, 234 such that the fourth byte A3 is output from the first multiplexer 206, the fourth byte B3 is output from the second multiplexer 220 and the fourth byte C3 is output from the third multiplexer 234. The calibration adjustment logic 120 may repeat this sequence (e.g., four times).

The bit pattern selection logic 200 may include a fourth multiplexer 248 coupled to the first through third multiplexers 206, 220, 234. More specifically, the outputs 216, 230, 244 of the first through third multiplexers 206, 220, 234 may couple to first through third inputs 250, 252, 254, respectively, of the fourth multiplexer 248. The fourth multiplexer 248 may be adapted to selectively output data, which was input by the fourth multiplexer 248, via an output 256 based on a control signal (e.g., select signal) Y input by the fourth multiplexer 248 via a fourth input 258. Control signal Y may be one of the control signals Y0–Y8 stored in the fourth register 118 of the second array 110.

In this manner, during a sequence of cycles, respective bytes A0–A3 of the first configuration data bit pattern may be input by the fourth multiplexer 248 via the first input 250, respective bytes B0–B3 of the second configuration data bit pattern may be input via the second input 252, respective bytes C0–C3 of the third configuration data bit pattern may be input via the third input 254 and respective bytes A0–A3, B0–B3 or C0–C3 may be output from the fourth multiplexer 248 based on the control signal Y. In this manner, the fourth multiplexer 248 may select one of the configuration data bit patterns.

The bit pattern selection logic 200 may include a fifth multiplexer 260 coupled to the fourth multiplexer 248. More specifically, the output 256 of the fourth multiplexer 248 may couple to a first input 262 of the fifth multiplexer 260. A second input 264 of the fifth multiplexer 260 may be coupled to the first array 106. Bytes of a corresponding 1024-bit configuration data bit pattern from the first array may be input by the second input 264 of the fifth multiplexer 260. The fifth multiplexer 260 may be adapted to selectively output data, which was input by the fifth multiplexer 260, via an output 266 based on a control signal (e.g., select signal) Z input by the fifth multiplexer 260 via a third input 268. The calibration adjustment logic 120 may provide control signal Z based on whether the memory system calibration is performed while the memory system 100 is in the first operating state or the second operating state. While the memory system 100 is in the first operating state, the bit pattern selection logic 200 may output a corresponding configuration data bit pattern from the first array 106 to one or more pins 105 of the memory 104. In contrast, while the memory system 100 is in the second operating state, the bit pattern selection logic 200 may output a configuration data bit pattern from the second array 110 (e.g., the first, second or third configuration data bit pattern) to one or more pins 105 of the memory 104.

The calibration adjustment logic 120 described above is exemplary, and therefore, the calibration adjustment logic 120 may be configured differently. For example, the first through third multiplexers 206, 220, 234 may be adapted to receive as input larger or smaller bit patterns over the sequence cycles. Additionally or alternatively, a larger or smaller number of multiplexers may be employed in the bit pattern selection logic 200 such that a respective larger or smaller number of bit patterns may be input thereto.

Figure 3:
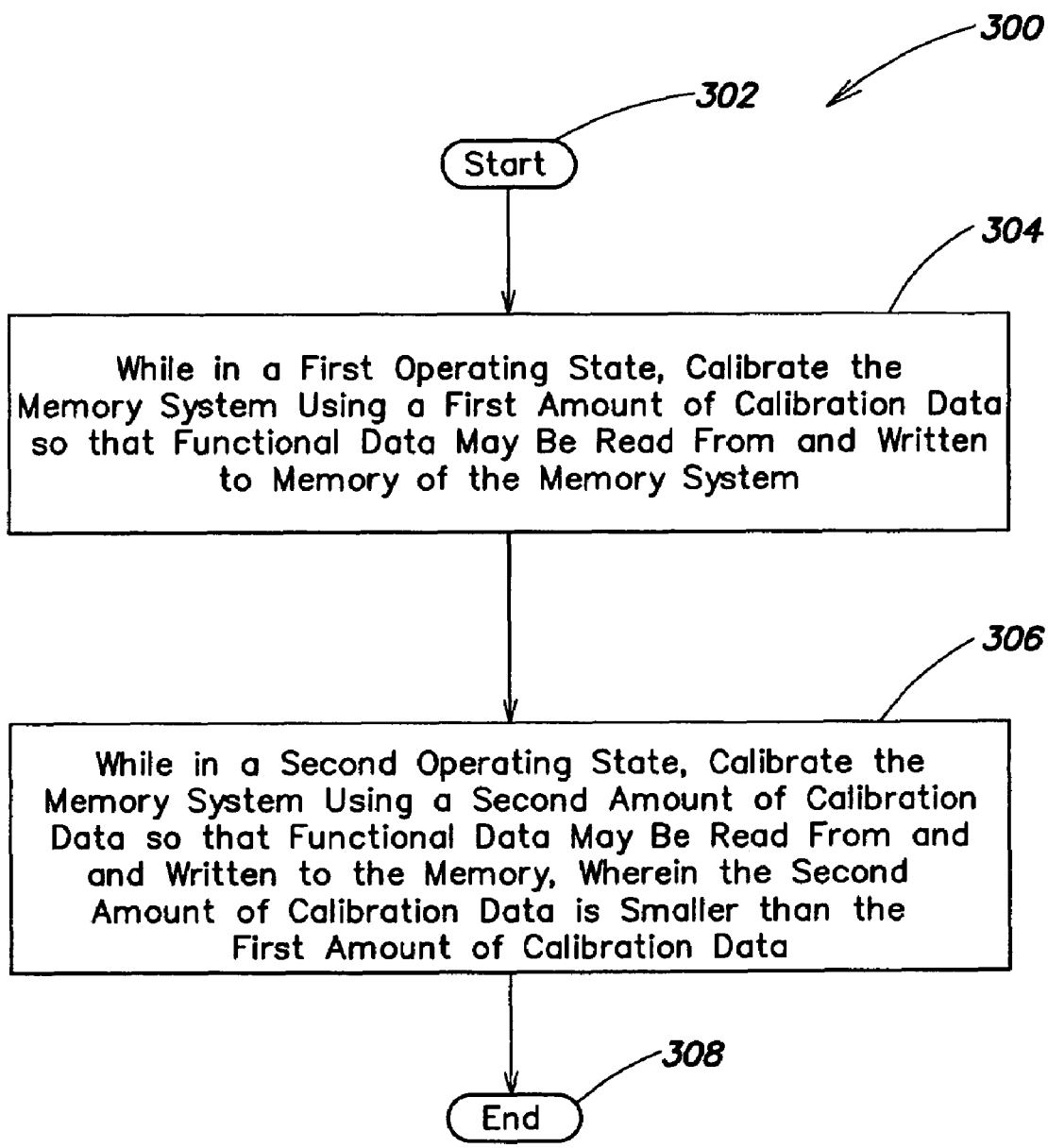
FIG. 3 illustrates a method of adjusting memory calibration in accordance with an embodiment of the present invention.

The operation of the system for calibrating memory is now described with reference to FIGS. 1–2 and with reference to FIG. 3 which illustrates a method of adjusting memory calibration in accordance with an embodiment of the present invention. With reference to FIG. 3, in step 302, the method 300 begins. In step 304, while in a first operating state, the memory system may be calibrated using a first amount of calibration data so that functional data may be read from and written to memory of the memory system. More specifically, the memory system 100 may be calibrated using the first amount of calibration data so functional data may be read from the memory 104 and stored by the MIC 102 and/or so functional data from the MIC 102 may be written to the memory 104. The first operating state may be an initialization state of the memory system. During this time, the memory system may initially be calibrated to read and write data (e.g., functional). For example, the memory system may be calibrated so that memory may capture functional data, such as an asserted signal serving as a bit, at a stable portion of the signal. The stable portion of the signal where the data is captured may be referred to as the data eye. To determine the data eye, during system calibration, the calibration adjustment logic 120 may receive a first set of calibration data, such as the thirty-six 1024-bit-wide configuration data bit patterns, and output such data bit patterns to respective pins 105 of the memory 104. The MIC 102 may store the first set of calibration data in the first data array 106 before calibrating (e.g., initially calibrating) the memory system 101. Although calibration so that a component of the memory system 100 such as the memory 104 may properly capture functional data is described above, it should be understood that the present methods may include calibration so that a component of the memory system 100 such as the memory 104 may properly transmit the functional data.

Once calibrated, the memory system 100 may be operated to write data (e.g., functional or actual data) to and/or read data (e.g., functional or actual data) from memory 104. However, during operation of the memory system 100 (e.g., to write functional data to and/or read functional data from memory), operating conditions such as temperature or voltage of the memory system 100, for example, may change compared to values of such factors while the memory system 100 was in the first operating state. For example, while the memory system 100 writes functional data to and/or reads functional data from memory 104, the temperature of the memory system 100 may increase. Changes in the operating conditions of the memory system 100 may cause the data eye to shift. The data eye shift may cause the memory system 100 to improperly capture data, and therefore, improperly write functional data to and/or read functional data from the memory 104. Therefore, the memory system 100 may require calibration. In this manner, the previous (e.g., initial) calibration of the memory system 100 may need to be adjusted.

Consequently, in step 306, while in a second operating state, the memory system may be calibrated using a second amount of calibration data so that functional data may be read from and written to the memory, wherein the second amount of calibration data is smaller than the first amount of calibration data. More specifically, the memory system 100 may be calibrated using the second amount of calibration data so functional data may be read from the memory 104 and stored by the MIC 102 and/or so functional data from the MIC 102 may be written to the memory 104. More specifically, while or after the memory system 100 is operated to write functional data to and/or read functional data from memory, the calibration adjustment logic 120 may receive a second set of calibration data, including the first, second and third configuration data bit patterns A0–A3, B0–B3, C0–C3 and output such data bit patterns to corresponding pins 105 of the memory 104. The memory system 100 may be calibrated (e.g., re-calibrated) based on the second set of calibration data. In this manner, a shift in data eye caused by a change in operating conditions of the memory system may be accommodated by an offset determined during calibration using the second set of calibration data. As stated, the second set of calibration data may include the three configuration data bit patterns A0–A3, B0–B3, C0–C3, each of which may be thirty-two bits wide. In contrast, the first set of calibration data may include thirty-six 1024-bit configuration data bit patterns. Therefore, the second set of calibration data includes fewer configuration data bit patterns, each of which is smaller (e.g., narrower) than the configuration data bit patterns in the first set of calibration data. Consequently, the second set of calibration data may include a smaller amount of data than the first set of calibration data.

For example, during a sequence of cycles (e.g., sixteen clock cycles), the first configuration data bit (or byte) pattern A0A1A2A3 repeated four times may be output from the fifth multiplexer 260 of the first bit pattern selection logic 202, the second configuration data bit (or byte) pattern B0B1B2B3 repeated four times may be output from the fifth multiplexer 260 of the second bit pattern selection logic 204 and the third configuration data bit (or byte) pattern C0C1C2C3 repeated four times may be output from the fifth multiplexer of third bit pattern selection logic (not shown) of the calibration adjustment logic 120. Similarly, the first configuration data bit pattern A0A1A2A3 repeated four times may be output from fourth bit pattern selection logic 200, the second configuration data bit pattern B0B1B2B3 repeated four times may be output from fifth bit pattern selection logic 200, the third configuration data bit pattern C0C1C2C3 repeated four times may be output from sixth bit pattern selection logic 200, the first configuration data bit pattern A0A1A2A3 repeated four times may be output from seventh bit pattern selection logic 200, the second configuration data bit pattern B0B1B2B3 repeated four times may be output from eighth bit pattern selection logic 200 and the third configuration data bit pattern C0C1C2C3 repeated four times may be output from ninth bit pattern selection logic 200. Control signals Y0–Y8 from the fourth register 118 of the second array 110 may be applied to the fourth multiplexer 248 of the first through ninth bit pattern selection logic 200, respectively, to output data from the calibration adjustment logic 120 in the above-described manner.

In some embodiments, the output of the first bit pattern selection logic 202 may be applied to pins 1, 10, 19 and 28 of the memory 104, the output of the second bit pattern selection logic 204 may be applied to pins 2, 11, 20 and 29 of the memory, an output of the third bit pattern selection logic 200 may be applied to pins 3, 12, 21 and 30 of the memory, and so on. In this manner, different configuration data bit patterns may be applied to adjacent memory pins 105. Outputs of one or more of the first through ninth bit pattern selection logic 200 may be coupled to more or less and/or different memory pins 105.

Thereafter, step 308 may be performed. In step 308, the method ends. Through use of the method 300 of FIG. 3, calibration may occur on a signal when it is transmitted to the memory 104 and/or when the signal is received by the memory 104. For example, a memory system 100 may be calibrated (e.g., initially calibrated) to read actual or functional data from and/or write actual or functional data to memory 104 using a first amount of calibration data. Thereafter, the memory system 100 may be operated to store actual or functional data in the memory 104. Operating conditions of the memory system 100 may change while the memory system 100 stores actual or functional data (e.g., during run-time) which may affect the memory system's ability to read actual or functional data from and/or write actual or functional data to the memory 104. Therefore, the memory system 100 may be recalibrated to read actual or functional data from and/or write actual or functional data to the memory 104 (e.g., during operation). However, a smaller amount of calibration data may be employed to recalibrate the memory than that required for the previous (e.g., the initial) memory system calibration. For example, the memory system 100 may employ the same configuration bit pattern for non-adjacent memory pins 105 during recalibration, thereby reducing a number of different bit patterns employed. Additionally or alternatively, a size of bit patterns employed during recalibration may be smaller than those employed during a previous (e.g., the initial) calibration. In this manner, the memory system 100 may operate in a mode in which the memory system 100 is initially calibrated. Thereafter, the memory system 100 may operate in a functional mode in which memory 104 of the memory system 100 may read and/or write actual or functional data. From the functional mode, the memory system 100 may operate (e.g., periodically) in a periodic calibration mode in which the memory system 100 is calibrated (e.g., re-calibrated). Thereafter, the memory system 100 may resume operation in the functional mode. Further, because the present methods and apparatus reduce an amount of data employed to calibrate (e.g., recalibrate) the memory system 100 compared to that required for the previous calibration (e.g., the initial calibration), the present methods and apparatus may reduce an amount of space (e.g., chip real estate) required to store the data employed to recalibrate the memory system 100. The savings in amount of data employed for memory system recalibration may have little or no impact on the effectiveness of the memory system calibration. However, the present methods and apparatus may provide the memory system 100 with flexibility to provide any desired bit pattern on neighboring nets.

The foregoing description discloses only exemplary embodiments of the invention. Modifications of the above disclosed apparatus and methods which fall within the scope of the invention will be readily apparent to those of ordinary skill in the art. For instance, in some embodiments, to recalibrate the memory system 100, a bit pattern corresponding to each memory pin 105 may be stored and employed to recalibrate the memory system 100. Each corresponding bit pattern may be smaller than bit patterns employed during a previous (e.g., initial) calibration. For example, in such embodiments, thirty-six 32-bit bit patterns may be employed. Therefore, in such embodiments recalibration of the memory system may require 144 bytes of data compared to the 4608 bytes employed during the initial calibration. However, such embodiments may employ more bits to recalibrate the memory system 100 than the embodiments described above with reference to FIGS. 1–3, which may calibrate the memory system using 123 bits (e.g., three 32-bit configuration data bit patterns and 27 control bits).

The present methods and apparatus may be coupled to and/or included in a high data rate memory system. More specifically, the present methods and apparatus may provide periodic timing calibration adjustments to the high data rate memory system to accommodate for shifts in the data eye resulting from changes in operating conditions during runtime. In this manner, the present methods and apparatus may obtain reliable phase offset values for both directions of a bi-directional link of such memory system.

Accordingly, while the present invention has been disclosed in connection with exemplary embodiments thereof, it should be understood that other embodiments may fall within the spirit and scope of the invention, as defined by the following claims.

The invention claimed is:

1. A method of adjusting memory system calibration, comprising:
   while in a first operating state, calibrating the memory system using a first amount of calibration data so that functional data may be read from and written to memory of the memory system; and
   while in a second operating state, calibrating the memory system using a second amount of calibration data so that functional data may be read from and written to the memory, wherein the second amount of calibration data is smaller than the first amount of calibration data.

2. The method of claim 1 further comprising:
   storing the first amount of calibration data; and
   storing the second amount of calibration data.

3. The method of claim 1 wherein:
   in the first operating state, the memory system is initialized; and
   in the second operating state, the memory system stores or reads functional data.

4. The method of claim 1 wherein calibrating the memory system using the first amount of calibration data includes:
   storing a first set of bit patterns which correspond to respective pins of the memory, wherein each bit pattern is of a first size; and
   transmitting the bit patterns to respective pins of the memory.

5. An apparatus for adjusting memory system calibration, comprising:
   a first array for storing a first amount of calibration data;
   a second array for storing a second amount of calibration data, wherein the second amount of calibration data is smaller than the first amount of calibration data; and
   calibration adjustment logic coupled to the first and second arrays;
   wherein the calibration adjustment logic is adapted to:
      while the memory system operates in a first operating state, calibrate the memory system using the first amount of calibration data so that functional data may be read from and written to memory of the memory system; and
      while the memory system operates in a second operating state, calibrate the memory system using the second amount of calibration data so that functional data may be read from and written to the memory.

6. The apparatus of claim 5 wherein the apparatus is adapted to:
   store the first amount of calibration data in the first array; and
   store the second amount of calibration data in the second array.

7. The apparatus of claim 5 wherein:
   in the first operating state, the memory system is initialized; and
   in the second operating state, the memory system stores or reads functional data.

8. The apparatus of claim 5 wherein the apparatus is adapted to:
   store a first set of bit patterns, which correspond to respective pins of the memory, in the first array, wherein each bit pattern is of a first size; and
   transmit the bit patterns to respective pins of the memory.

9. The apparatus of claim 8 wherein the apparatus is further adapted to:
   store a second set of bit patterns, each of which corresponds to a plurality of pins of the memory, in the second array, wherein each bit pattern is of a second size smaller than the first; and
   transmit the bit patterns from the second set to corresponding pins of the memory.

10. The apparatus of claim 9 wherein the second set includes fewer bit patterns than the first set.

11. The apparatus of claim 9 wherein the apparatus is further adapted to transmit the same bit pattern from the second set to non-adjacent pins of the memory.

12. A system for adjusting memory system calibration, comprising:
an apparatus for adjusting memory system calibration having:
a first array for storing a first amount of calibration data;
a second array for storing a second amount of calibration data, wherein the second amount of calibration data is smaller than the first amount of calibration data; and
calibration adjustment logic coupled to the first and second arrays; and
a memory coupled to the apparatus for adjusting memory system calibration;
wherein the calibration adjustment logic is adapted to:
while the memory system operates in a first operating state, calibrate the memory system using the first amount of calibration data so that functional data may be read from and written to the memory of the memory system; and
while the memory system operates in a second operating state, calibrate the memory system using the second amount of calibration data so that functional data may be read from and written to the memory.

13. The system of claim 12 wherein the apparatus is adapted to:
store the first amount of calibration data in the first array; and
store the second amount of calibration data in the second array.

14. The system of claim 12 wherein:
in the first operating state, the memory system is initialized; and
in the second operating state, the memory system stores or reads functional data.

15. The system of claim 12 wherein the apparatus is adapted to:
store a first set of bit patterns, which correspond to respective pins of the memory, in the first array, wherein each bit pattern is of a first size; and
transmit the bit patterns to respective pins of the memory.

16. The system of claim 15 wherein the apparatus is further adapted to:
store a second set of bit patterns, each of which corresponds to a plurality of pins of the memory, in the second array, wherein each bit pattern is of a second size smaller than the first and the second set includes fewer bit patterns than the first set; and
transmit the bit patterns from the second set to corresponding pins of the memory.

17. The system of claim 16 wherein the apparatus is further adapted to transmit the same bit pattern from the second set to non-adjacent pins of the memory.

18. A method of adjusting memory system calibration, comprising:
while in a first operating state, calibrating the memory system using a first amount of calibration data so that functional data may be read from and written to memory of the memory system; and
while in a second operating state, calibrating the memory system using a second amount of calibration data so that functional data may be read from and written to the memory, wherein the second amount of calibration data is smaller than the first amount of calibration data;
wherein calibrating the memory system using the first amount of calibration data includes;
storing a first set of bit patterns which correspond to respective pins of the memory, wherein each bit pattern is of a first size; and
transmitting the bit patterns to respective pins of the memory; and
wherein calibrating the memory system using the second amount of calibration data includes:
storing a second set of bit patterns each of which corresponds to a plurality of pins of the memory, wherein each bit pattern is of a second size smaller than the first; and
transmitting the bit patterns from the second set to corresponding pins of the memory.

19. The method of claim 18 wherein the second set includes fewer bit patterns than the first set.

20. The method of claim 18 wherein transmitting the bit patterns from the second set to corresponding pins of the memory includes transmitting the same bit pattern from the second set to non-adjacent pins of the memory.

* * * * *